(12) United States Patent
Doumae

(10) Patent No.: US 7,312,124 B2
(45) Date of Patent: Dec. 25, 2007

(54) METHOD OF MANUFACTURING A SEMICONDUCTOR DEVICE

(75) Inventor: Yasuhiro Doumae, Minato-ku (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 310 days.

(21) Appl. No.: 11/079,296

(22) Filed: Mar. 15, 2005

(65) Prior Publication Data

US 2005/0277238 A1   Dec. 15, 2005

(30) Foreign Application Priority Data

Jun. 9, 2004   (JP) .............................. 2004-171265

(51) Int. Cl.
*H01L 21/8238* (2006.01)

(52) U.S. Cl. .................. 438/275; 438/218; 438/279

(58) Field of Classification Search ................ 438/257, 438/149, 151, 97, 684, 792, 218, 275
See application file for complete search history.

(56) References Cited

U.S. PATENT DOCUMENTS 5,668,035 A * 9/1997 Fang et al. ................. 438/239
6,518,130 B1 * 2/2003 Ohno ......................... 438/275
2003/0027384 A1 * 2/2003 Kawasaki et al. ........... 438/218
2006/0205129 A1 * 9/2006 Sato et al. .................. 438/197

FOREIGN PATENT DOCUMENTS

JP   02-271659   6/1990
JP   04-297063   10/1992

* cited by examiner

*Primary Examiner*—Carl Whitehead, Jr.
*Assistant Examiner*—Sonya D. McCall-Shepard
(74) *Attorney, Agent, or Firm*—Volentine & Whitt, P.L.L.C.

(57) ABSTRACT

A method of manufacturing a semiconductor device includes forming first and second active regions and a field region in a surface of a substrate; forming a first gate insulating film in the first and second active regions; covering the surface of the substrate with a first polycrystalline silicon film; exposing the first gate insulating film on the second active region by forming an aperture in the first polycrystalline silicon film over the second active region; removing the first gate insulating film in the second active region; forming a second gate insulating film which is thicker than the first gate insulating film in the second active region; covering the surface of the substrate with a second polycrystalline silicon film; removing the second polycrystalline silicon film on the first active region until it becomes a predetermined film thickness; and forming gate electrodes on the first and second active regions.

17 Claims, 18 Drawing Sheets

METHOD OF MANUFACTURING A SEMICONDUCTOR DEVICE

BACKGROUND OF THE INVENTION

1. Field of the Invention

The present invention relates to a method of manufacturing a semiconductor device. More specifically, the present invention relates to a method of manufacturing a semiconductor device where MOS type semiconductor elements having gate insulating films with different film thicknesses are formed on the same semiconductor substrate.

2. Background Information

With respect to the field of semiconductor devices, forming semiconductor elements driven by different power supply voltages on the same substrate has become common. In cases of forming MOS type semiconductor elements on the same substrate, since a withstand voltage demanded according to the power supply voltage may vary, a plurality of specifications are needed with respect to film thicknesses of gate insulating films formed on the same semiconductor substrate.

In general, when forming gate insulating films with different film thicknesses, a technique of performing an oxidization process in two or more steps is used. In most cases, the oxidization process is divided into two steps. This technique of oxidization is called double oxidization. By using the technique of double oxidization, a thin gate insulating film for internal circuit elements which require high-speed operation, and a thick gate insulating film for peripheral circuit elements which require a high withstand voltage can be formed on the same semiconductor substrate.

When forming gate insulating films by using the technique of double oxidization, for example, first a gate insulating film having a thickness between a thickness of a thick gate insulating film and a thickness of a thin gate insulating film is uniformly formed on the entire substrate by thermal oxidization. Then, this gate insulating film is removed only from the region where the thin gate insulating film is to be formed. After that, the entire surface of the substrate is oxidized again according to the specification of the thin gate insulating film. At this point, formations of both the thin gate insulating film and the thick gate insulating film are completed. In this re-oxidization process, the regions where the thin gate insulating film and the thick gate insulating film are to be formed are oxidized while the gate insulating film formed in the first oxidization process still remains in the region where the thick gate insulating film is to be formed. Therefore, the overall thickness of the gate insulating film formed in the region where the thick gate insulating film is to be formed should become thicker by the thickness of the gate insulating film formed in the re-oxidization process.

For example, manufacturing methods of semiconductor devices using the double oxidization technique are shown in Japanese Laid Open Patent Publication No. 2-271659, especially, pp. 3-4, and FIG. 1, and Japanese Patent Laid Open Patent Publication No. 4-297063, especially, p. 3, FIGS. 1 and 3. Japanese Laid-Open Patent Publication Nos. 2-271659 and 4-297063 are hereby incorporated by reference.

According to the double oxidization technique used in the manufacturing method of a semiconductor device as disclosed in Publication No. 2-271659 silicon nitride films used as oxidation resist films at the time of forming a field oxide film is further used as oxidation resist films for regions where thin gate insulating films are to be formed when forming a thick gate insulating film by using a LOCOS (Local Oxidation Of Silicon) method.

The manufacturing method of a semiconductor device shown in Japanese Laid-Open Patent Publication No. 4-297063 is similar to that of Publication No. 2-271659. Publication No. 4-297063 provides a modified example of the method in which the silicon nitride film used as the oxidation resist film at the time of forming the field oxide film is further used as the thick gate insulating film.

As mentioned above, in the generally used technique of double oxidizing, first a gate insulating film having a thickness between a thickness of a thick gate insulating film and a thickness of a thin gate insulating film is formed uniformly. For instance, supposing that the thin gate insulating film is 3 nm (nanometer) thick and the thick gate insulating film is 7 nm thick, a gate insulating film of about 5 to 6 nm in thickness would be formed in the first oxidization process. After the gate insulating film is formed, this gate insulating film is etched only at the region where the thin gate insulating film is to be formed. At this time, however, the field oxide film is also etched, and is made thinner. Such thinning of the field oxide film reduces the threshold voltage at which a parasitic MOS transistor turns on, and invites adverse effects with regards to the operation and reliability of a circuit.

According to the methods of manufacturing semiconductor devices given in the aforementioned Japanese Laid-Open Patent publications, in order to prevent the field oxide film from thinning due to the etching of the gate insulating film, a process of removing the gate insulating film is not included. However, the methods include a process of removing an underlay oxide film which is placed directly under the silicon nitride film for the purpose of stress relief. Since the underlay oxide film is about 20 nm thick, the field oxide film would become about 20 to 30 nm thinner by this etching process. If a bulk substrate having a semiconductor layer with sufficient thickness is used, thinning of the field oxide film by the thickness of about 20 to 30 nm does not pose any particular problem, because the field oxide film can be thickly formed to become several hundred nm in thickness. However, if an SOI (Silicon On Insulator) substrate or an SOS (Silicon On Sapphire) substrate is to be used, thinning of the field oxide film by the thickness of about 20 to 30 nm will pose a serious problem, because both the SOI substrate and the SOS substrate, where a semiconductor layer of either substrate is about 40 to 50 nm thick, have a field oxide film which is only 80 to 100 nm thick.

In view of the above, it will be apparent to those skilled in the art from this disclosure that there exists a need for an improved method of manufacturing a semiconductor device. This invention addresses this need in the art as well as other needs, which will become apparent to those skilled in the art from this disclosure.

SUMMARY OF THE INVENTION

It is therefore an object of the present invention to resolve the above-described problems, and to provide an improved method of manufacturing a semiconductor device. More specifically, it is an object of the present invention to provide a method of manufacturing a semiconductor device where MOS type semiconductor elements having gate insulting films with different film thicknesses are formed on the same semiconductor substrate.

In accordance with a first aspect of the present invention, a method of manufacturing a semiconductor device is provided. The method includes: preparing a support substrate;

forming first and second active regions and a field region on or in a surface of the support substrate; forming a first gate insulating film in the first and second active regions; covering the entire surface of the support substrate with a first polycrystalline silicon film; exposing the first gate insulating film on the second active region by forming an aperture in the first polycrystalline silicon film over the second active region; removing the first gate insulating film in the second active region; forming a second gate insulating film that is thicker than the first gate insulating film in the second active region; covering the entire surface of the support substrate with a second polycrystalline silicon film; removing the second polycrystalline silicon film on the first active region until it reaches a predetermined film thickness; and forming gate electrodes on the first and second active regions, respectively.

In accordance with another aspect of the present invention, a method of manufacturing a semiconductor device is provided. The method includes: preparing a support substrate; covering a surface of the support substrate with a first insulating film; covering a surface of the first insulating film with a second insulating film; removing the second insulating film from a region other than first and second predetermined regions; forming a field region at the region other than the first and second predetermined regions by subjecting the support substrate to thermal oxidation; covering the entire surface of the support substrate with a third insulating film; covering a surface of the third insulating film with a fourth insulating film; removing the third and fourth insulating films on the first and second predetermined regions until the second insulating film is exposed; removing the first and second insulating films on the first and second predetermined regions; forming a first gate insulating film in the first predetermined region; forming a second gate insulating film that is thicker than the first gate insulating film in the second active region; and forming gate electrodes on the first and second predetermined regions, respectively.

These and other objects, features, aspects, and advantages of the present invention will become apparent to those skilled in the art from the following detailed description, which, taken in conjunction with the annexed drawings, discloses preferred embodiments of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Figure 1A:
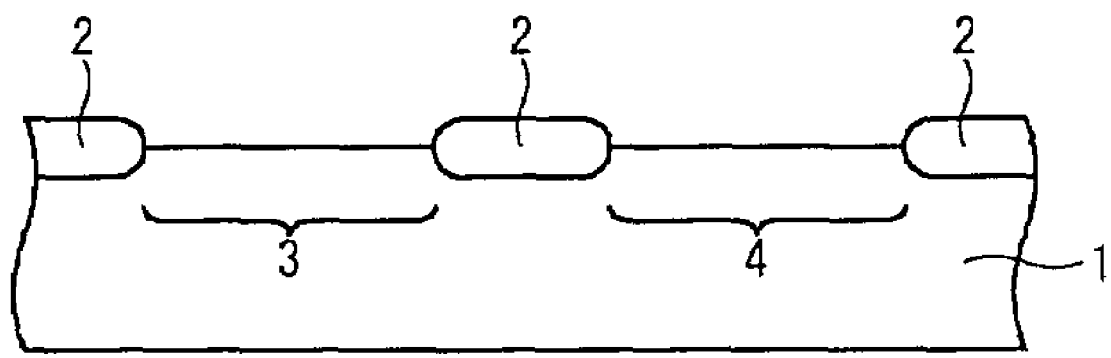
FIGS. 1a to 1g are views of cross-sectional diagrams illustrating a method of manufacturing a semiconductor device in accordance with a first embodiment of the present invention.

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

Referring now to the drawings, preferred embodiments of the present invention will be described in detail.

(1) First Embodiment

In a first preferred embodiment of the present invention, a case in which a thin gate oxide film is removed before a thick gate oxide film is formed will be explained as an example. Moreover, in this case, a polycrystalline silicon film is used as an oxidation resist film at the time of forming the thick gate oxide film.

FIGS. 1a to 1g are cross-sectional views provided to explain a method of manufacturing a semiconductor device according to the first embodiment of the present invention.

Figure 2A:
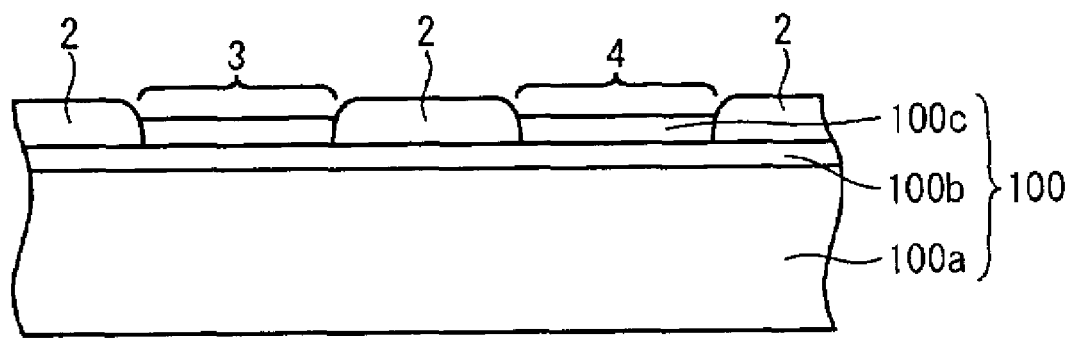
FIGS. 2a and 2b are views of cross-sectional diagrams illustrating a method of manufacturing a semiconductor device in case in which an SOI substrate and an SOS substrate are used in the first embodiment of the present invention.
Figure 2B:
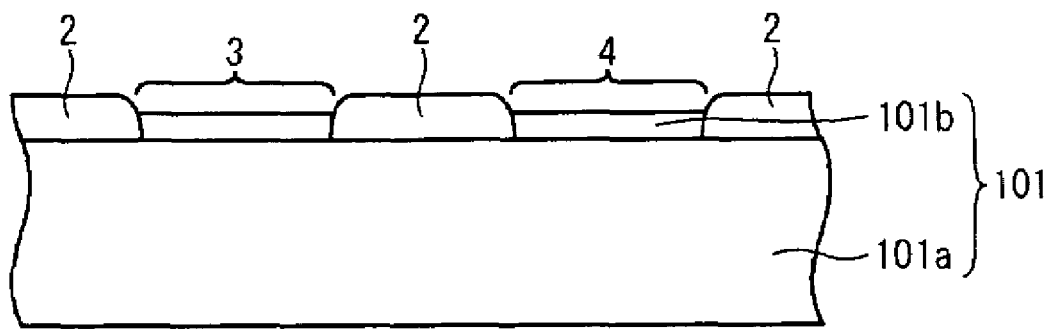

As shown in FIG. 1a, in the method of manufacturing a semiconductor device according to the first embodiment of present invention, first a silicon oxide film and a silicon nitride film (not shown), both used as a buffer of which are formed one by one on a silicon support substrate 1. Next, using a known LOCOS method or the like, a field oxide film 2 is formed for element separation. Herewith, a field region, which is the region where the field oxide film 2 is formed, and active regions 3 and 4 are formed. In later processes, an MOS type semiconductor element with a thin gate insulating film is formed in the active region 3 and an MOS type semiconductor element with a thick gate insulating film is formed in the active region 4. In addition, the silicon support substrate 1 is not limited to a bulk substrate. For example, it is also possible to use an SOI substrate 100 as shown in FIG. 2a, and an SOS substrate 101 as shown in FIG. 2b. In FIG. 2a, 100a represents a silicon substrate, 100b represents a buried oxide film, and 100c represents a semiconductor layer. In FIG. 2b, 101a represents a sapphire substrate and 101b represents a semiconductor layer.

Figure 1B:
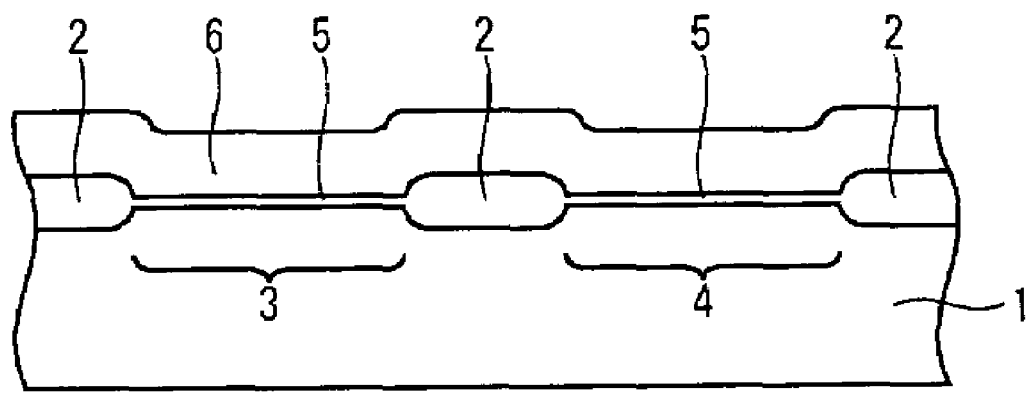

Next, as shown in FIG. 1b, thin gate oxide films 5 are formed on the active region 3 and the active region 4 by a known thermal oxidization technique. The thin gate oxidization film 5 is preferably about 3 nm thick. Then, a polycrystalline silicon film 6 (first polycrystalline film) is formed by depositing polycrystalline silicon on the entire surface using a CVD (Chemical Vapor Deposition) method or the like.

Figure 1C:
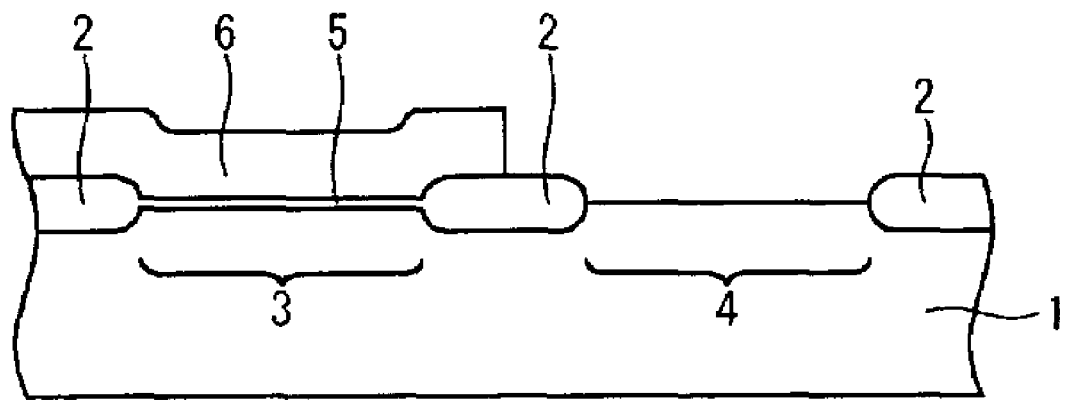

Next, a photoresist (not shown) is applied on the polycrystalline silicon film 6. Further, through processes of exposure and development, a resist pattern having an aperture in the upper part of the active region 4 is formed on the polycrystalline silicon film 6. Next, the polycrystalline film 6 exposed at the aperture is removed by etching while using the resist pattern as a mask. Then, the thin gate oxide film 5 in the active region 4 is removed using hydrofluorinated (HF) etchant. By this process, the surface of the silicon substrate 1 in the active region 4 is exposed as shown in FIG. 1c. In the etching process of the thin gate oxide film 5, the surface of the field oxide film 2 not covered with the polycrystalline silicon film 6 is etched away for about 4.5 to 6 nm (1.5 times to twice the thickness of the thin gate oxide film 5 which is 3 nm thick), and thus the field oxide film 2 is made thinner. However, in the usual bulk substrate, since the field oxide film 2 is about 500 to 1000 nm thick, thinning of 4.5 to 6 nm is so small that the effects thereof can be mostly disregarded. Likewise, in the SOI substrate or the SOS substrate, since the field oxide films 2 as shown in FIGS. 2a and 2b are about 80 to 100 nm thick, thinning of 4.5 to 6 nm is so small that it can be mostly disregarded.

Figure 1D:
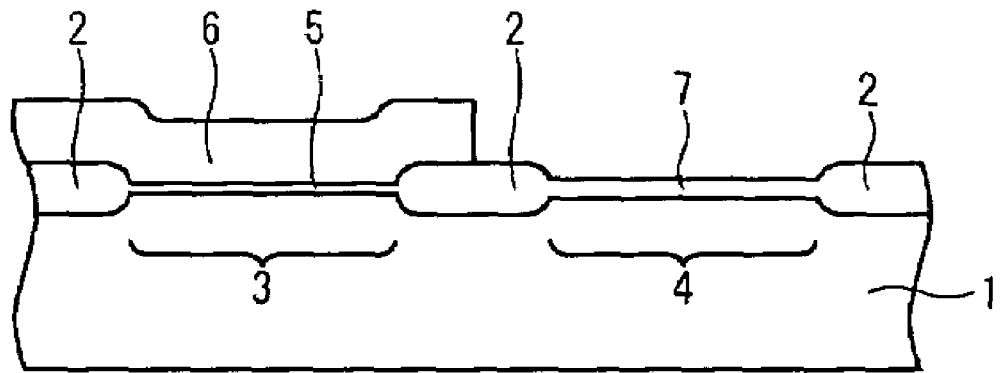

Next, as shown in FIG. 1d, a thick gate oxide film 7 is formed in the active region 4 by the known thermal oxidization technique. The thick gate oxidization film 7 is preferably about 7 nm thick. During the thermal oxidization process to form the thick gate oxide film 7, the polycrystalline silicon film 6 works as an oxidation resist mask in the active region 3 where the thin gate oxide film 5 is already being formed. Accordingly, the thin gate oxide film 5 will not become any thicker by the re-oxidization.

Figure 1E:
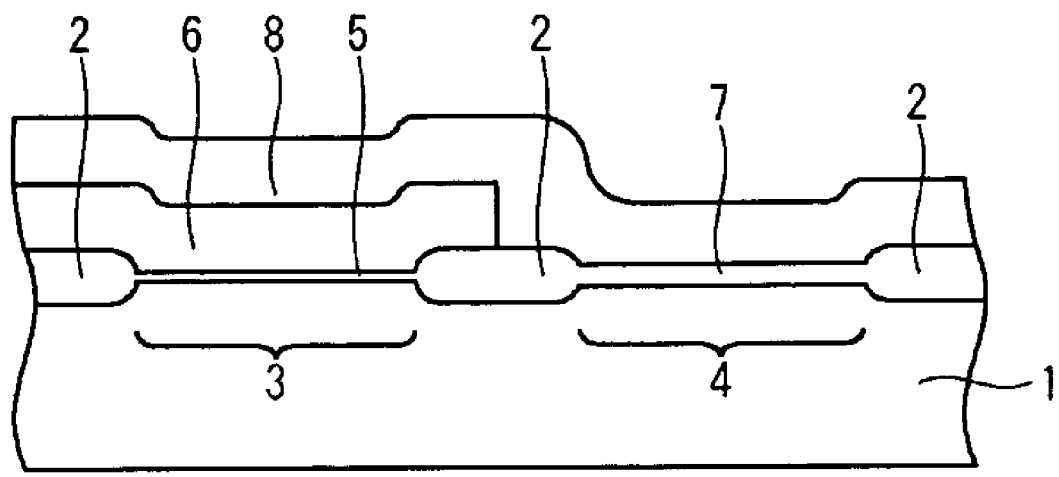

Next, a polycrystalline silicon film 8 (second polycrystalline film) is formed by depositing polycrystalline silicon on the entire surface using the CVD method or the like. By this process, a film thickness of the polycrystalline silicon film 8 on the active region 3 is formed to be the film thickness of the polycrystalline silicon film 8 on the active region 4, as shown in FIG. 1e.

Figure 1F:
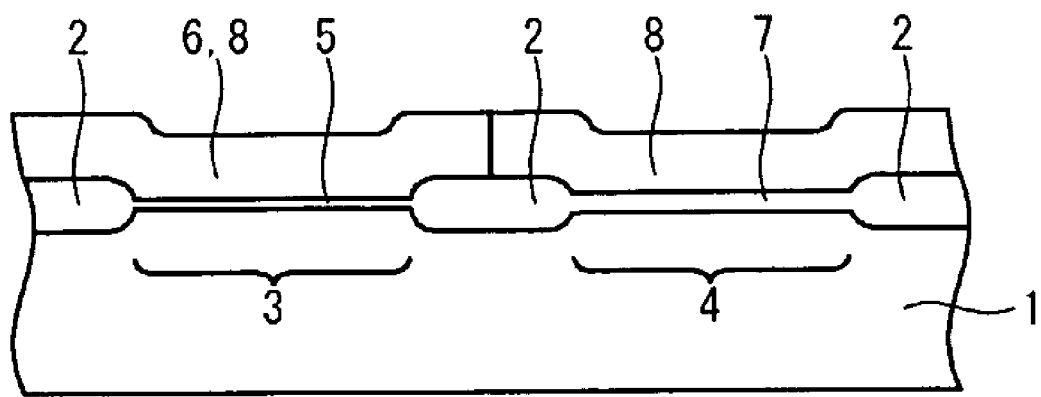

Next, as shown in FIG. 1f, using a known lithography technique and etching technique, the polycrystalline silicon film 8 on the active region 3 is removed until it reaches to a predetermined film thickness.

Figure 1G:
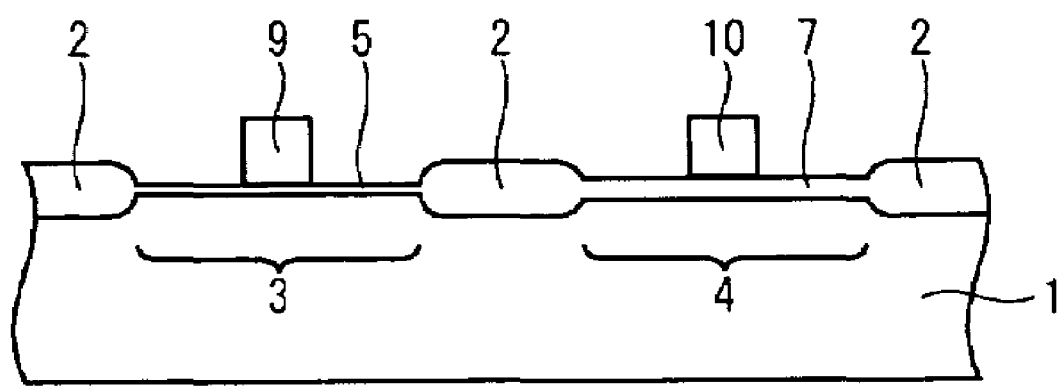

Next, as shown in FIG. 1g, using the known lithography and etching techniques, a gate electrode 9 is formed on the active region 3, and a gate electrode 10 is formed on the active region 4. After this, MOS type semiconductor elements are formed (not show) using a known method.

Although this embodiment shows a method of forming two kinds of gate oxide films, the present invention can also be applied in manufacturing a semiconductor device having gate oxide films with three or more different film thicknesses.

Operational Effect

According to the method of manufacturing a semiconductor device with respect to the first embodiment of the present invention, in forming gate oxide films with different film thicknesses, the thin gate oxide film 5 is formed uniformly before the thick gate oxide film 7 is formed. After that, the thin gate oxide film 5 in the active region 4 where the thick gate oxide film 7 is to be formed is removed, and then the thick gate oxide film 7 is formed in the active region 4. Therefore, the amount of outage of the field oxide film 2 at the time of removing the gate oxide film can be reduced. Specifically, when the film thickness of the thin gate oxide film 5 is set to 3 nm, the amount of outage is approximately 1% with respect to the bulk substrate where the field oxide film is about 500 to 1000 nm thick. Also in the SOI substrate or the SOS substrate where the field oxide film is about 80 to 100 nm thick, the amount of outage is below 10%.

Furthermore, since the polycrystalline silicon being a material of the gate electrodes is used as an oxidation resist mask when forming the thick oxide film 7, it is possible to form the gate oxide films with different thicknesses and the gate electrodes at the same time.

As used herein, the following directional terms "forward, rearward, above, downward, vertical, horizontal, below, and transverse" as well as any other similar directional terms refer to those directions of a device equipped with the present invention. Accordingly, these terms, as utilized to describe the present invention should be interpreted relative to a device equipped with the present invention.

ALTERNATE EMBODIMENTS

Alternate embodiments will now be explained. In view of the similarity between the first and alternate embodiments, the parts of the alternate embodiments that are identical to the parts of the first embodiment will be given the same reference numerals as the parts of the first embodiment. Moreover, the descriptions of the parts of the alternate embodiments that are identical to the parts of the first embodiment may be omitted for the sake of brevity.

(2) Second Embodiment

In a second preferred embodiment of the present invention, a field oxide film is formed using the LOCOS method, and then the film thickness of the field oxide film is augmented using the CVD method. Moreover, the surface is planarized using an SOG (Spin on Glass) method to eliminate level differences on the surface.

FIGS. 3a to 3g are cross-sectional views provided to explain a method of manufacturing a semiconductor device according to the second embodiment of the present invention.

Figure 3A:
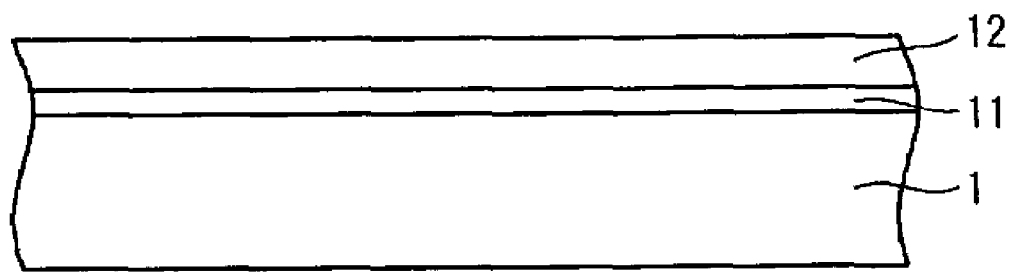
FIGS. 3a to 3g are views of cross-sectional diagrams illustrating a method of manufacturing a semiconductor device according to second and third embodiments of the present invention.
Figure 4A:
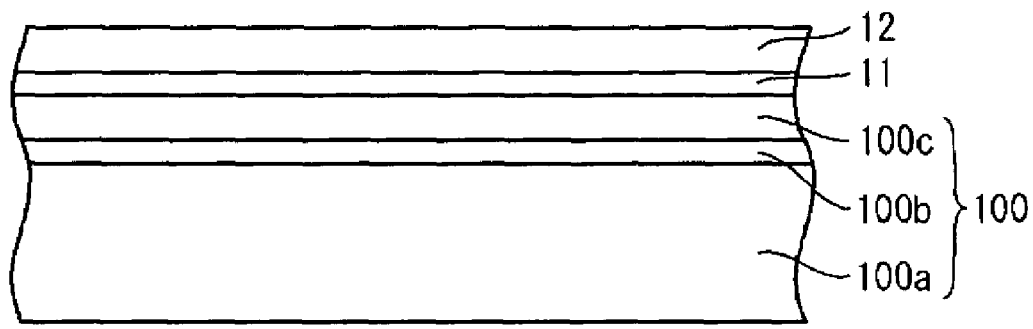
FIGS. 4a and 4b are views of cross-sectional diagrams illustrating a method of manufacturing a semiconductor device in case in which an SOI substrate and an SOS substrate are used in the second or third embodiment of the present invention.
Figure 4B:
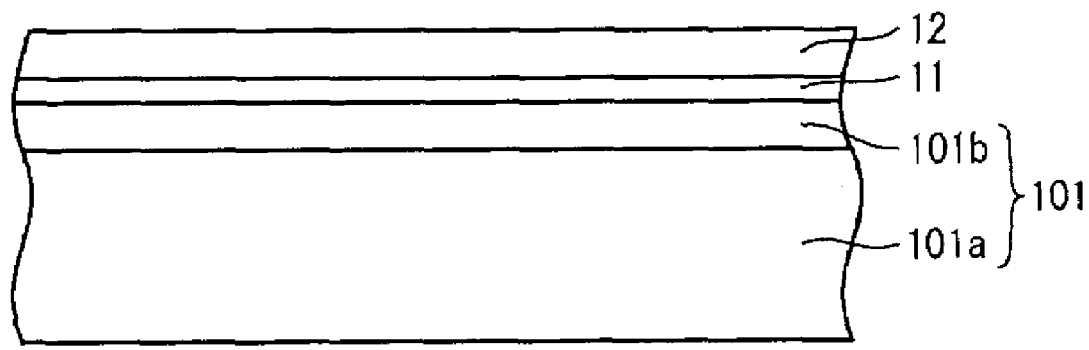

As shown in FIG. 3a, in the method of manufacturing a semiconductor device according to the second embodiment of the present invention, at first, a silicon oxide film 11 is formed on the silicon support substrate 1 by thermal oxidation. Then a silicon nitride film 12 is formed on the silicon oxide film 11 by depositing silicon nitride using the CVD method. The silicon oxide film 11 performs as an underlay oxide film, and the silicon nitride film 12 performs as an oxidation resist mask at the time of forming a field oxide film, which is described later. In addition, the silicon support substrate 1 is not limited to a bulk substrate. For example, it is also possible to use an SOI substrate 100 as shown in FIG. 4a, and an SOS substrate 101 as shown in FIG. 4b. In FIG. 4a, 100a represents a silicon substrate, 100b represents a buried oxide film, and 100c represents a semiconductor layer. In FIG. 4b, 101a represents a sapphire substrate and 101b represents a semiconductor layer.

Figure 3B:
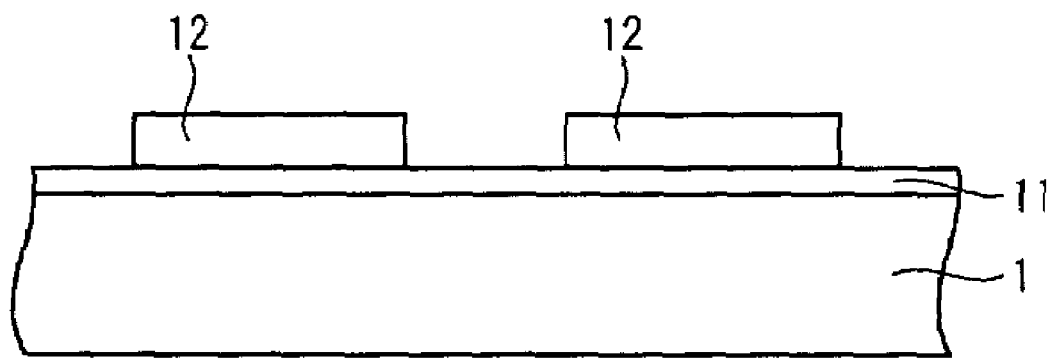

Next, a photoresist (not show) is applied on the silicon nitride film 12, and through processes of exposure and development, a resist pattern having an aperture in the upper part of a field region is formed on the silicon nitride film 12. Next, the silicon nitride film 12 is removed by etching while using the resist pattern as a mask. By this process, the surface of the silicon oxide film 11 in the field region is exposed as shown in FIG. 3b. In addition, although the silicon oxide film 11 in the field region preferably remains in this embodiment, it may be removed as well.

Figure 3C:
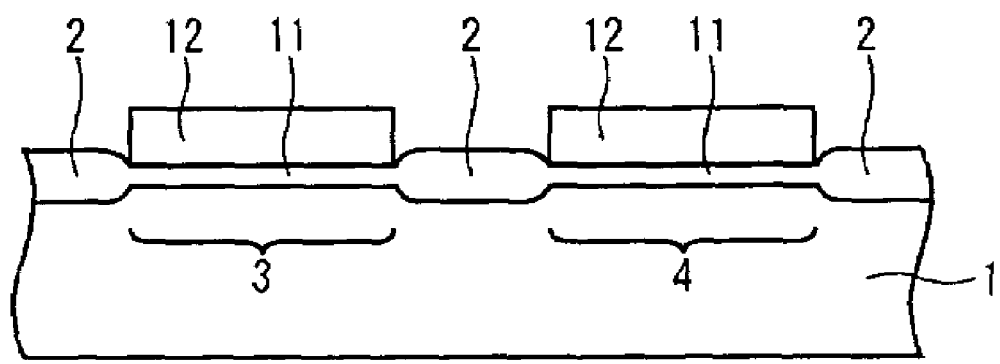

Next, the photoresist is removed, and then the silicon support substrate 1 is thermally oxidized through the silicon oxide film 11. By this process, a field oxide film 2 is formed in the field region as shown in FIG. 3c. At the same time, an active region 3 and an active region 4 are formed in the silicon support substrate 1 as shown in FIG. 3c.

Figure 3D:
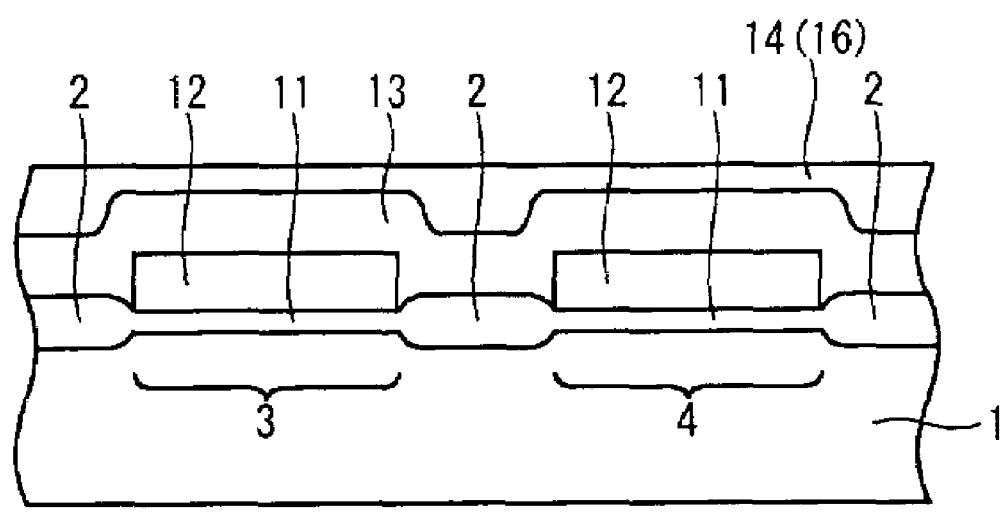

Next, as shown in FIG. 3d, a silicon oxide film 13 is formed by depositing silicon oxide on the entire surface using the CVD method, and a silicon oxide film 14 is formed on the silicon oxide film 13 using the SOG method. The purpose of forming the silicon oxide film 14 is to eliminate level differences on the surface of the silicon oxide film 13.

Figure 3E:
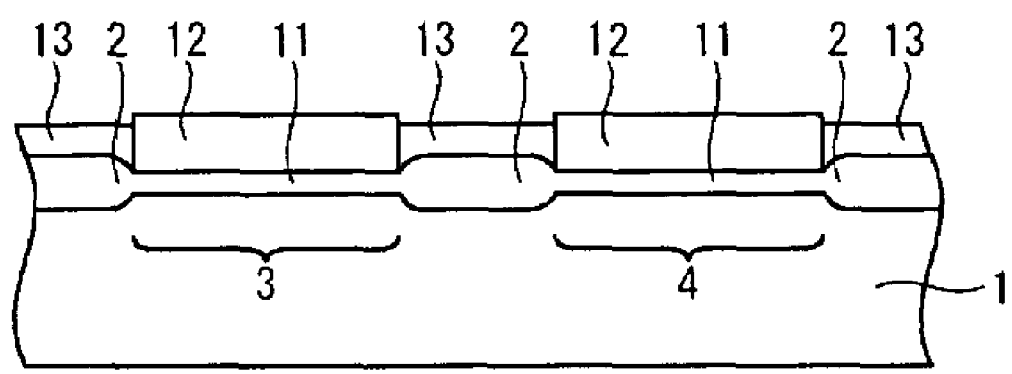

Next, as shown in FIG. 3e, the silicon oxide film 13 and the silicon oxide film 14 are etched back until the surface of the silicon nitride film 12 in the active region 3 and the active region 4 is exposed. In this etching back process, the silicon oxide film 14 must be completely removed. The reason is that an SOG film is a liquid solution melting and combining with silica (SiO$_2$) into a solvent such as alcohol or the like, and it contains comparatively much moisture. For this reason, if the etching back of the SOG film is not completely finished, the remainder of the SOG film may become a cause of erosion or the like.

Figure 3F:
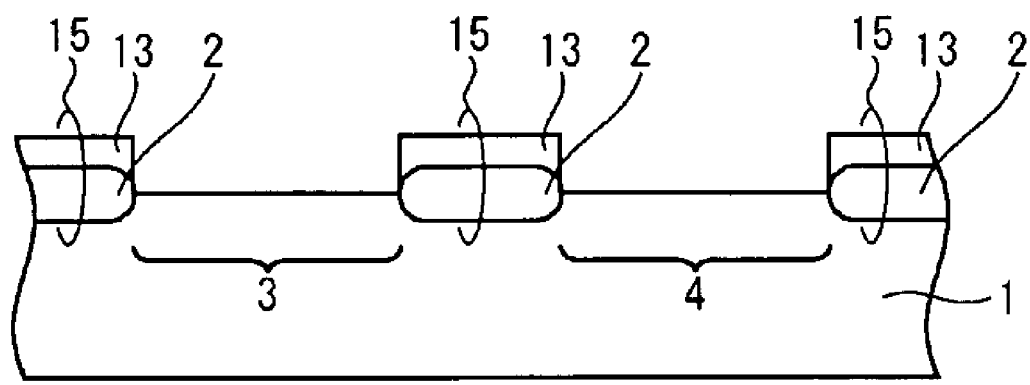

Next, as shown in FIG. 3f, the silicon nitride film 12 and the silicon oxide film 11 on the active region 3 and the active region 4 are selectively removed one by one by etching. By this process, a thick field oxide film 15, which is constituted from the field oxide film 2 formed by the thermal oxidation and the silicon oxide film 13 formed by the CVD method, is formed.

Figure 3G:
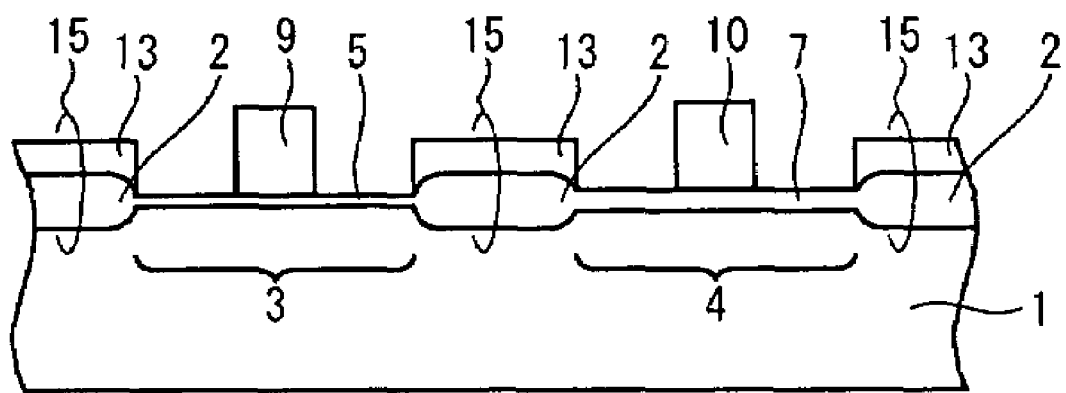

Next, as shown in FIG. 3g, a thin gate oxide film 5 is formed in the active region 3 and a thick gate oxide film 7 is formed in the active region 4, by using a conventional double oxidization technique. In other words, first a gate oxide film having a thickness between a thickness of the thin gate oxide film 5 and a thickness of the thick gate oxide film 7 is formed uniformly, and through a process of partially removing the gate oxide film, the two kinds of gate oxide films are formed. In addition, the gate oxide film is formed by thermal oxidation, plasma oxidization or radical oxidization. Then, using the known lithography technique and etching technique, a gate electrode 9 is formed on the active region 3, and a gate electrode 10 is formed on the active region 4

After this, MOS type semiconductor elements are formed (not show) using a known method.

Although this embodiment shows a method of forming two kinds of gate oxide films, the present invention can also be applied in manufacturing a semiconductor device having gate oxide films with three or more different film thicknesses.

Operational Effect

According to the method of manufacturing a semiconductor device with respect to the second embodiment of the present invention, by augmenting the film thickness of the field oxide film 2, which is formed using the LOCOS method, by using the CVD method in advance, the level difference between the element separation region and the two active regions, where one is to form the thin gate oxide film and the other is to form the thick gate oxide film, can be set to be large. Therefore, even if the conventional double oxidization technique, which is already a completed technique is applied, the amount of outage in this case does not pose a serious problem. Thus, this method is especially effective with respect to the SOI substrate, and the SOS substrate which cannot form a thick field oxide film.

(3) Third Embodiment

In a third embodiment, a field oxide film is formed using the LOCOS method, and then the film thickness of the field oxide film is augmented using the CVD method as with the second embodiment of the present invention. In this embodiment, the surface is planarized by a BPSG (Boron Phosphorous Silicon Glass) and level differences of the surface are eliminated.

A method of manufacturing a semiconductor device according to the third embodiment of the present invention can be explained by referring to the cross-sectional views FIGS. 3a to 3g as referenced in the second embodiment.

However, in the third embodiment of the present invention, the silicon oxide film 14 in the second embodiment shown in FIG. 3d is replaced with a BPSG film 16. In other words, in this embodiment, the silicon oxide film 13 is formed on the entire surface using the CVD method, and then the BPSG film 16 is deposited on the silicon oxide film 13 using the CVD method. Then, the BPSG film 16 is subjected to reflow and the level differences of the surface are eliminated.

The SOG film as used in the second embodiment has to be removed completely by etching back or the like. As opposed to this, by using the BPSG film, which does not contain moisture, restrictions on the process can be reduced. Moreover, since the BPSG film has a reflow characteristic of liquidizing at comparatively low temperature, it is also useful as a material of the film for planarization.

In addition, in this embodiment, the silicon support substrate 1 is not limited to a bulk substrate. For example, it is also possible to use the SOI substrate 100 as shown in FIG. 4a, and the SOS substrate 101 as shown in FIG. 4b.

Operational Effect

According to the method of manufacturing a semiconductor device with respect to the third embodiment of the present invention, by augmenting the film thickness of the field oxide film 2, which is formed using the LOCOS method, by using the CVD method in advance, the level difference between the element separation region and the two active regions, where one is to form the thin gate oxide film and the other is to form the thick gate oxide film, can be set to be large. Therefore, even if the conventional double oxidization which is already a completed technique is applied, the amount of outage in this case does not pose a serious problem. Thus, this method is especially effective with respect to the SOI substrate and the SOS substrate that cannot form a thick field oxide film. Furthermore, by using the BPSG film as the material of the film for planarization, the problem, such as erosion resulting from the remainder of the SPG film not being etched back, as is noted in the case of using the SOG film, does not arise, and thereby the restrictions on the process can be reduced.

As mentioned above, in accordance with the present invention, in a case of forming gate insulating films with different thicknesses, first a relatively thin first gate insulating film is formed. Then, the first gate insulating film is removed only from a region where a relatively thick gate insulating film is to be formed. After that, re-oxidization is performed to form a thick second gate insulating film. Since the first gate insulating film to be removed is thin, thinning (outage) of the field oxide film occurring at the time of removing the gate insulating film, which has posed problems in the conventional technique of double oxidization, can be reduced. Furthermore, in the process of re-oxidization to form the thick second gate insulating film, by having a polycrystalline silicon film used as an oxidation resist film for the thin first gate insulating film, it is possible to form the gate electrodes at the same time.

Furthermore, in accordance with another aspect of the present invention, a field oxide film is made thicker by previously having insulating films being laminated. Therefore, even if thinning (outage) of the field oxide film arises at the time of removing the gate insulating film, the influence can be reduced. This invention is effective especially in manufacturing semiconductor devices which use substrates such as the SOI substrate and SOS substrate that cannot form thick field oxide films.

This application claims priority to Japanese Patent Application No. 2004-171265. The entire disclosure of Japanese Patent Application No. 2004-171265 is hereby incorporated herein by reference.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A method of manufacturing a semiconductor device, comprising:
    preparing a support substrate;
    covering a surface of said support substrate with a first insulating film;
    covering a surface of said first insulating film with a second insulating film;
    removing said second insulating film from a region other than first and second predetermined regions;
    forming a field region at said region other than said first and second predetermined regions by subjecting said support substrate to thermal oxidation;
    covering an entirety of said first and second predetermined regions and said field region with a third insulating film;
    covering a surface of said third insulating film with a fourth insulating film;
    removing said third and fourth insulating films on said first and second predetermined regions until said second insulating film is exposed, so that said third insulating film remains on said field region;
    removing said first and second insulating films on said first and second predetermined regions, so that said third insulating film remains on said field region;
    forming a first gate insulating film in said first predetermined region;
    forming a second gate insulating film in said second active region, said second gate insulating film being thicker than said first gate insulating film; and
    forming respectively gate electrodes over said first and second predetermined regions.

2. The method of manufacturing a semiconductor device according to claim 1, wherein said support substrate is a bulk silicon substrate, an SOI substrate, or an SOS substrate.

3. The method of manufacturing a semiconductor device according to claim 2, wherein said third insulating film is a silicon oxide film formed by using a CVD method.

4. The method of manufacturing a semiconductor device according to claim 3, wherein said fourth insulating film is a silicon oxide film formed by using a SOG method.

5. The method of manufacturing a semiconductor device according to claim 3, wherein said fourth insulating film is a silicon oxide film that includes boron and phosphorus.

6. The method of manufacturing a semiconductor device according to claim 2, wherein said first insulating film is a silicon oxide film and said second insulating film is a silicon nitride film.

7. The method of manufacturing a semiconductor device according to claim 1, wherein said third insulating film is a silicon oxide film formed by using a CVD method.

8. The method of manufacturing a semiconductor device according to claim 7, wherein said fourth insulating film is a silicon oxide film formed by using a SOG method.

9. The method of manufacturing a semiconductor device according to claim 7, wherein said fourth insulating film is a silicon oxide film that includes boron and phosphorus.

10. A method of manufacturing a semiconductor device comprising:
    forming a first insulating film on a substrate;
    forming a second insulating film on the first insulating film;
    removing a portion of the second insulating film to expose a surface of the first insulating film;
    oxidizing the exposed surface of the first insulating film to form a field region;
    forming a third insulating film on the second insulating film and the field region;
    forming a fourth insulating film on the third insulating film;
    removing portions of the third and fourth insulating films to expose the second insulating film and so that the third insulating film remains on the field region;
    removing portions of the first and second insulating films to expose first and second regions of the substrate and so that the third insulating film remains on the field region;
    forming respective first and second gate insulating films on the first and second regions of the substrate, the first gate insulating film being thicker than the second gate insulating film; and
    forming respective first and second gate electrodes on the first and second gate insulating films.

11. The method of manufacturing a semiconductor device of claim 10, wherein said forming a third insulating film comprises a chemical vapor deposition process that forms silicon oxide, and
    said forming a fourth insulating film comprises a spin on glass process that forms silicon dioxide.

12. The method of manufacturing a semiconductor device of claim 10, wherein said first insulating film is silicon oxide and the second insulating film is silicon nitride.

13. The method of manufacturing a semiconductor device of claim 10, wherein the fourth insulating film is silicon oxide that includes boron and phosphorus.

14. The method of manufacturing a semiconductor device of claim 10, wherein the substrate is a bulk silicon substrate.

15. The method of manufacturing a semiconductor device of claim 10, wherein the substrate is an SOI substrate.

16. The method of manufacturing a semiconductor device of claim 10, wherein the substrate is an SOS substrate.

17. A method of manufacturing a semiconductor device, comprising:
    preparing a support substrate;
    covering a surface of said support substrate with a first insulating film;
    covering a surface of said first insulating film with a second insulating film;

removing said second insulating film from a region other than first and second predetermined regions;

forming a field region at said region other than said first and second predetermined regions by subjecting said support substrate to thermal oxidation;

covering an entire surface of said support substrate with a third insulating film;

covering a surface of said third insulating film with a fourth insulating film;

removing said third and fourth insulating films on said first and second predetermined regions until said second insulating film is exposed;

removing said first and second insulating films on said first and second predetermined regions;

forming a first gate insulating film in said first predetermined region;

forming a second gate insulating film being thicker than said first gate insulating film in said second active region; and forming respectively gate electrodes on said first and second predetermined regions, wherein said support substrate is a bulk silicon substrate, an SOI substrate, or an SOS substrate, and wherein said first insulating film is a silicon oxide film and said second insulating film is a silicon nitride film.

* * * * *